United States Patent [19]

Tozun

[11] 4,356,504
[45] Oct. 26, 1982

[54] MOS INTEGRATED CIRCUIT STRUCTURE FOR DISCRETIONARY INTERCONNECTION

[75] Inventor: Orhan N. Tozun, Milpitas, Calif.

[73] Assignee: International Microcircuits, Inc., Santa Clara, Calif.

[21] Appl. No.: 134,968

[22] Filed: Mar. 28, 1980

[51] Int. Cl.³ ...................... H01L 27/02; H01L 29/34
[52] U.S. Cl. .......................................... 357/42; 357/54
[58] Field of Search .............................. 357/41, 42, 54

[56] References Cited

U.S. PATENT DOCUMENTS

| | | | |
|---|---|---|---|
| 3,365,707 | 1/1968 | Mayhew | 357/41 |
| 3,465,293 | 9/1969 | Weckler | 357/41 |
| 4,063,274 | 12/1977 | Dingwall | 357/42 |
| 4,128,773 | 12/1978 | Troutman et al. | 357/42 |

OTHER PUBLICATIONS

RCA COS/MOS Integrated Circuits Manual RCA Somerville, N.J., (3/71), pp. 24-26.

Primary Examiner—Gene M. Munson
Attorney, Agent, or Firm—Harry M. Weiss

[57] ABSTRACT

A flexible, symmetrical, MOS integrated circuit structure and layout employing a unit cell approach for customized wiring. Special features include multiple contacts on individual source/drain elements, rectilinear interconnections in the X- and Y- directions, and interconnection underpasses integral with the source and drain regions of the individual devices. The structure is especially applicable to complementary MOS integrated circuits of large complexity.

10 Claims, 4 Drawing Figures

MOS INTEGRATED CIRCUIT STRUCTURE FOR DISCRETIONARY INTERCONNECTION

BACKGROUND OF THE INVENTION

1. Field of the Invention

This invention relates generally to integrated circuits and, more particularly, to complementary MOS type integrated circuits.

2. Description of the Prior Art

With the advent of large scale integration of the MOS circuits, most of the production circuits are standard products with dedicated wiring. While the structure and layout may then be optimized for the particular circuit, large amounts of engineering time is required and may only be justified by volume production. Where potential usage is at a much lower volume, layout time is prohibitive and, hence, there is currently minimal custom MOS circuit business. The approaches suggested by the ensuing disclosure make custom large scale integration a viable alternative to interconnection of random logic functions at the package level for low-volume applications.

SUMMARY OF THE INVENTION

It is an object of this invention to provide an improved complementary MOS cell design.

It is a further object of this invention to provide an improved complementary MOS cell design which can be used in a master slice semiconductor chip.

It is a still further object of this invention to provide an improved complementary MOS cell design which can be used in a master slice semiconductor chip wherein both the P-channel and N-channel devices operate at the same speeds.

Among the other objectives of this invention, there is provided:

a cell design allowing X- and Y-mirror imaging of the layout;

all via holes for contacting the individual elements with the discretionary wiring are on an X/Y grid for straight-line interconnection;

symmetrical design which allows functional blocks to be moved around anywhere in the circuit morphology;

all wiring underpasses suitably related to the transistor elements in terms of type of construction in order to eliminate differences in conductivity;

speed matched N- and P-channel MOS device pairs;

even distribution of power among the functional blocks; and use of separate P conductivity-type wells to isolate the large N conductivity-type buffer devices so that they can be powered separately from the internal logic.

These objectives and others are provided by the following features of the layout of the MOS and CMOS integrated circuit:

1. A unit cell comprising three transistors of a single conductivity type.

2. Each cluster of three transistors comprises four source and/or drain regions.

3. Each source and/or drain region has two vias for making contact therewith; one of each pair of vias lies on either side of the negative or positive supply busses.

4. In the CMOS version of the circuit, the N-channel devices are formed to have an effective width approximately one-third that of the P-channel devices in order to compensate for the mobility differences in the respective channels.

5. This effective width ratio of the N versus P channel devices is accomplished by separating a portion of the source or drain region of the N-channel device from the gate region in order that the source and/or drain region is still long enough to provide the feature of one contact via on either side of a supply bus.

6. The supply busses make contact with the substrate or, in the case of CMOS devices, the P conductivity-type well region at each unit cell.

The above and other objects, features, and advantages of the invention will be better understood from the following detailed description taken in conjunction with the accompanying drawings, in which:

DESCRIPTION OF THE PREFERRED EMBODIMENT

Many ways of implementing single channel or complementary MOS integrated circuits are well known. A choice among these approaches is based largely on yield and performance tradeoffs and is relatively independent of the layout of the MOS devices of the instant invention which is applicable to any one of a number of possible MOS fabrication techniques; therefore, the description proceeds directly to a recitation of the salient features of the layout of FIG. 1, which is the top view of a portion of a partially completed CMOS integrated circuit according to the principles of the present invention.

Figure 1:
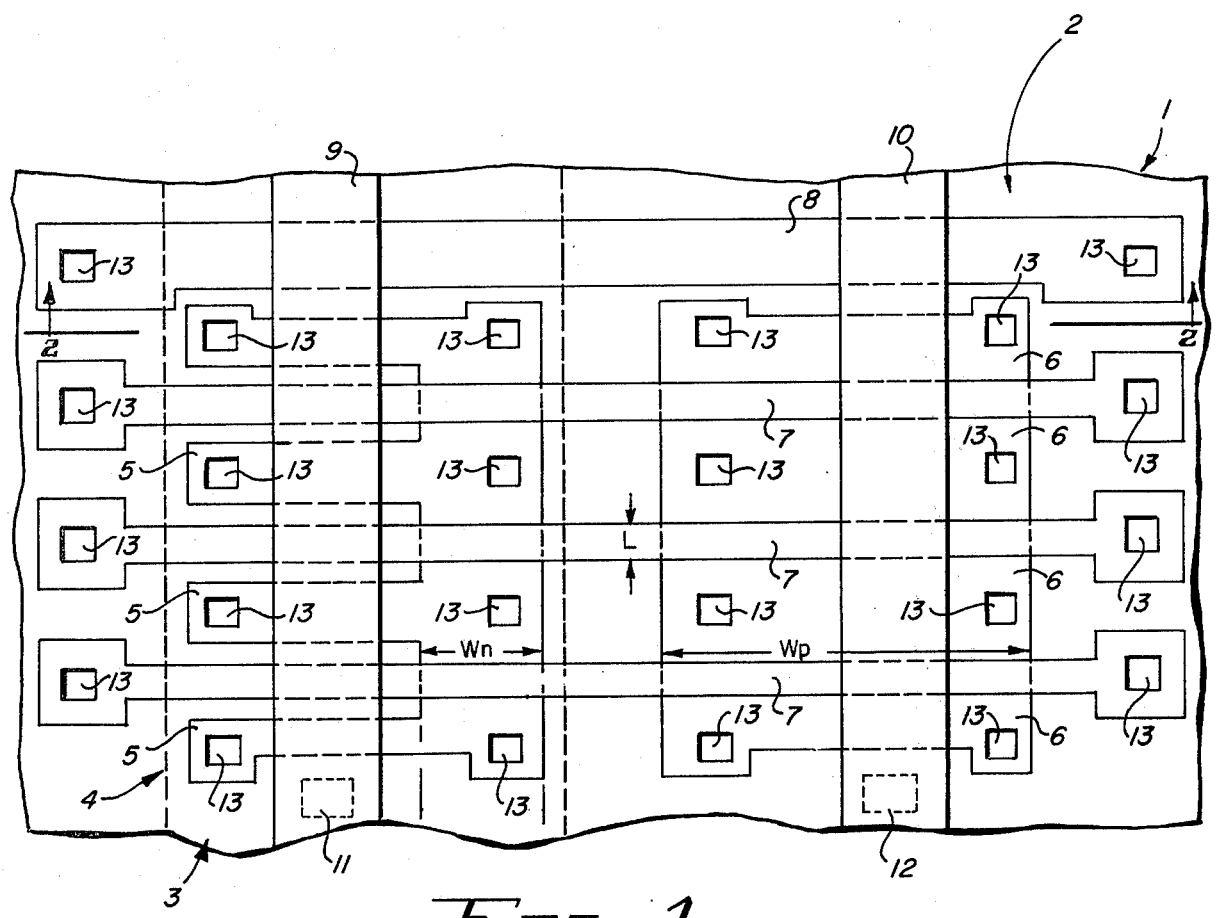
FIG. 1 is a top view of a unit cell of a CMOS version of the device prior to the application of the discretionary wiring.
Figure 2:
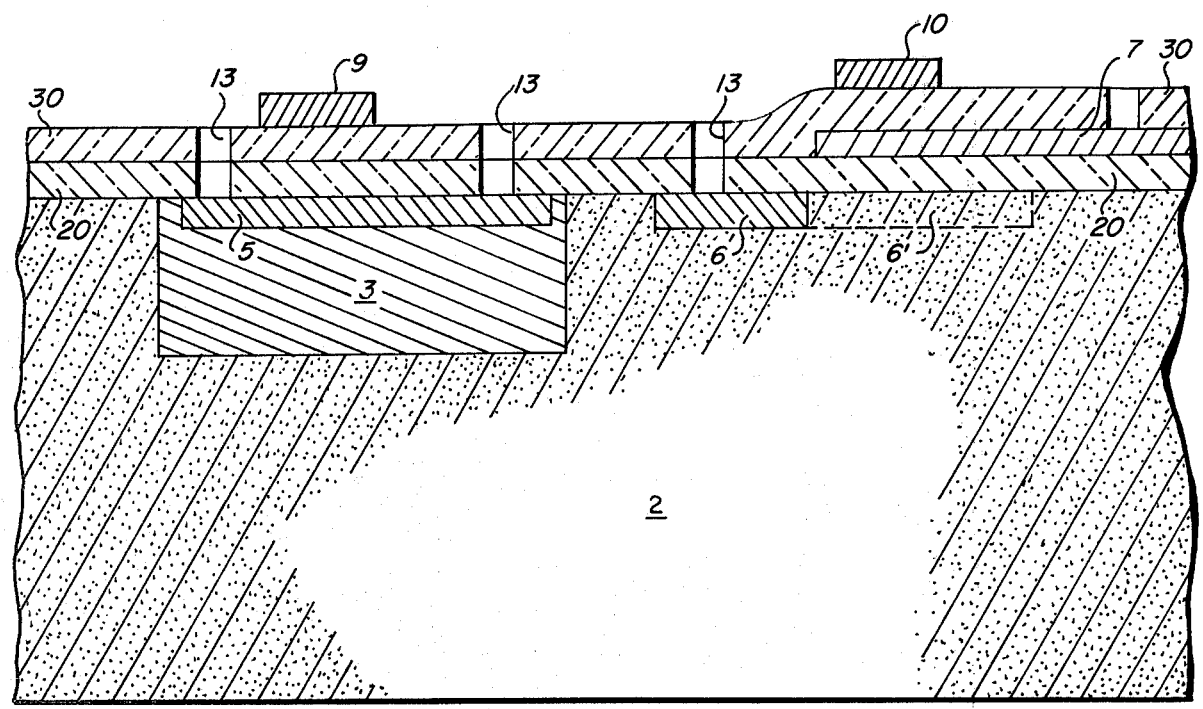
FIG. 2 is a cross-sectional view of FIG. 1 taken on the line 2—2 of FIG. 1 showing the details of the construction of the diffused layers, the insulating layers, and the interconnecting layers of the MOS integrated circuit.

FIG. 2 is a cross-section of FIG. 1 showing the constructional features in more detail and, thus, will be described in conjunction with FIG. 1.

FIG. 1 is a portion of a semiconductor substrate 1 containing numerous MOS devices; one unit cell is illustrated. The substrate 1 itself is divided into numerous portions of different conductivity type. In accordance with established practice, 2 is a N-type region which both comprises the major portion of the substrate and provides a region for the location of the P-channel MOS devices. Region 3 is a P conductivity-type well formed in the N-type substrate and is used as a location for the devices of N conductivity type. This well may be common with several unit cells or may be confined to one or more N-channel transistors or unit cells in order to isolate them from the other N-channel transistors. Regions 6 are of P conductivity type and are formed in the N conductivity-type portion 2 of the substrate 1 forming the source and drain regions of three P-channel MOS transistors which are shown in the right-hand portion of FIG. 1. Regions 5 are formed of N conductivity type in the P well 3 and, again, form three N-channel MOS transistors in the left-hand portion of FIG. 1.

In the CMOS embodiment of FIGS. 1 and 2, each one of the three transistors of each conductivity type have common gate regions 7 with each one of the three transistors of opposite conductivity type. As shown in FIG. 2, these gate regions 7 lay over insulating layer 20 and, hence, form the channels of the conducting devices. The gate regions are preferably of polycrystalline silicon, but may be formed of metal or metal silicides according to the fabrication method selected. In the CMOS embodiment, each gate 7 is common to both the N-channel device on the left-hand side of FIG. 1 and to the P-channel device on the right-hand side of FIG. 1. The source and drain regions 5 of the N-channel transistors and 6 of the P-channel transistors are seen to be common for the central and extreme devices of each three transistor clusters. This achieves partial interconnection of devices in a unit cell as will be described in more detail hereinafter.

One of the important features for achieving the objectives of this invention is shown by both the P and N channel devices in FIG. 1. Each device has source and drain regions with two contact means 13 at the extremities of the source and drain regions. In FIG. 1, these contact regions consist of holes or vias through insulating layers 20 and 30 permitting the application of metal contact means to both ends of the source and drain regions. As shown, metal busses 9 and 10 lay over their sources, drains, and gates on top of insulator region 30 which separates and insulates the metal regions from the gate regions 7 as shown in FIG. 2. In the CMOS embodiment, the metal conductor 10 is connected to the positive supply. By virtue of the contact holes 13 in the extremities of each source and drain region of every device, current may flow in the source and drain at right angles to the metalization layers 9 and 10; thereby producing an interconnection underpass which is extremely useful in complex wiring. The provision of the two contact holes 13 to each source and drain region reduces the number of structures which would otherwise be required in order to provide such underpass interconnection. For example, in FIG. 1, 8 is a conducting layer of the same construction as the gate region 7, but does not serve as a gate because there are no source and drain regions adjacent thereto. This layer also has contact means 13 at each of its extremities which allow underpass interconnection where such an interconnection necessarily passes under both metal layers 9 and 10. The provision of additional conductive layers such as 8 to provide the function of the doubly-contacted source/drain regions would result in unnecessary complications of the layout of the integrated circuit. While FIG. 1 shows contact means for connection at both extremities of the sources and drains of both channel conductivity type devices, such means are useful in a circuit where only single conductivity type transistors are employed.

The channel length of each transistor in FIG. 1 is set by the dimension L. The effective peripheral widths of the channels of both conductivity type devices is determined by the dimensions of source and drain regions contiguous with gate regions 7. In the illustration of FIG. 1, Wp designates the width of the P-channel transistor channel while Wn designates the width of the N-channel transistor. While the total lengths of the source and drain regions of both conductivity type devices are approximately the same, it will be seen that the effective channel widths of the N-channel transistors are substantially less than the widths of the channels of the P-channel devices; this is ordinarily desirable because of the greater conduction in the N-channel devices which is due to the greater mobility of electrons than holes. This electron/hole mobility ratio varies from about two and one-half to three depending on the doping and orientation of the channel region itself. In order to maintain the interconnection underpass feature described hereinabove of the shorter width N-channel devices, the N-channel sources and drains have a total peripheral width which is about the same as those of the P-type devices; however, the effective widths of the N-channel sources and drains are only about one-third that of the total peripheral width by virtue of the fact that N conductivity-type regions 5 are displaced from gate region 7 over about two-thirds of their total peripheral width.

Another feature of the layout of FIG. 1 which contributes to the objectives of this invention is the provision of an enhanced P-type conductivity region in the P conductivity type well 3 beneath portion 11 of metal region 9. This serves to make good contact to the P-type well which has a high sheet resistivity. Similarly, enhanced regions of N conductivity type are provided beneath region 12 of metal layer 10 in order to maintain the potential of region 2 at the supply level. The provision of these contacts to these heavily doped regions helps to insure uniform current distribution throughout a large scale integrated circuit comprising a multiplicity of the cells of the type shown in FIG. 1.

Figure 3:
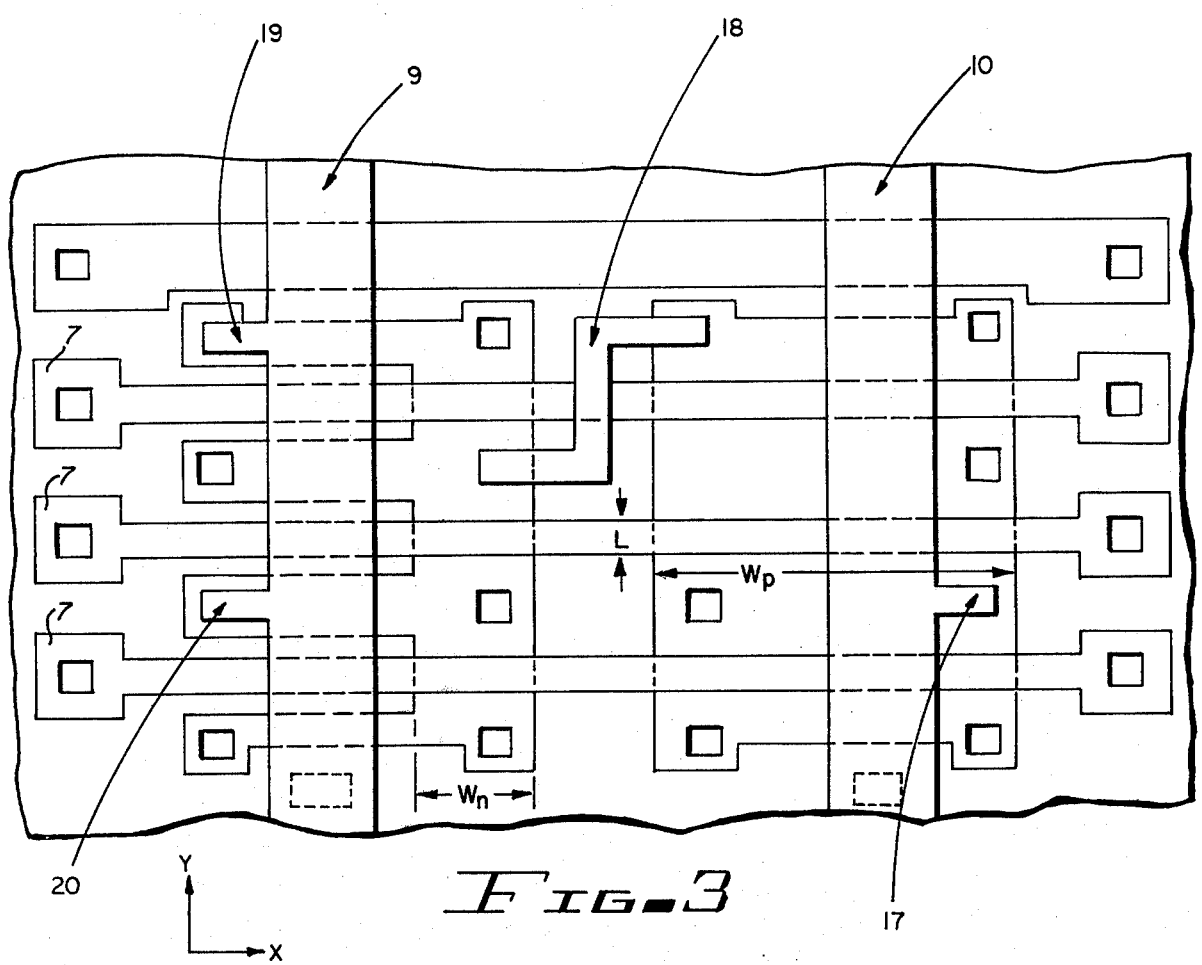
FIG. 3 is an illustration of a NOR gate embodiment of the unit cell of FIG. 1 after application of the discretionary wiring.

FIG. 3 shows the circuit layout of FIG. 1 at the discretionary winding stage of the internal cells of the device cluster. This figure illustrates the provision of a NOR function from the cell of FIG. 1. Here, metal connection 17 contacts positive supply line 10 to provide power to a first P-channel device. Metallic interconnection 18 on an X-Y grid connects between another P-channel device (connected by its drain with the first P-channel device) and a pair of N-channel devices whose sources are interconnected with the negative supply line metalization 9 by metallic connections 19 and 20 which make contact with one of the two source/drain contact holes described earlier. A more complex function than a NOR gate may be provided by interconnecting additional ones of the devices in this Figure or where a yet higher level of integration is required by interconnection with adjacent unit cells as more particularly shown in FIG. 4.

Figure 4:
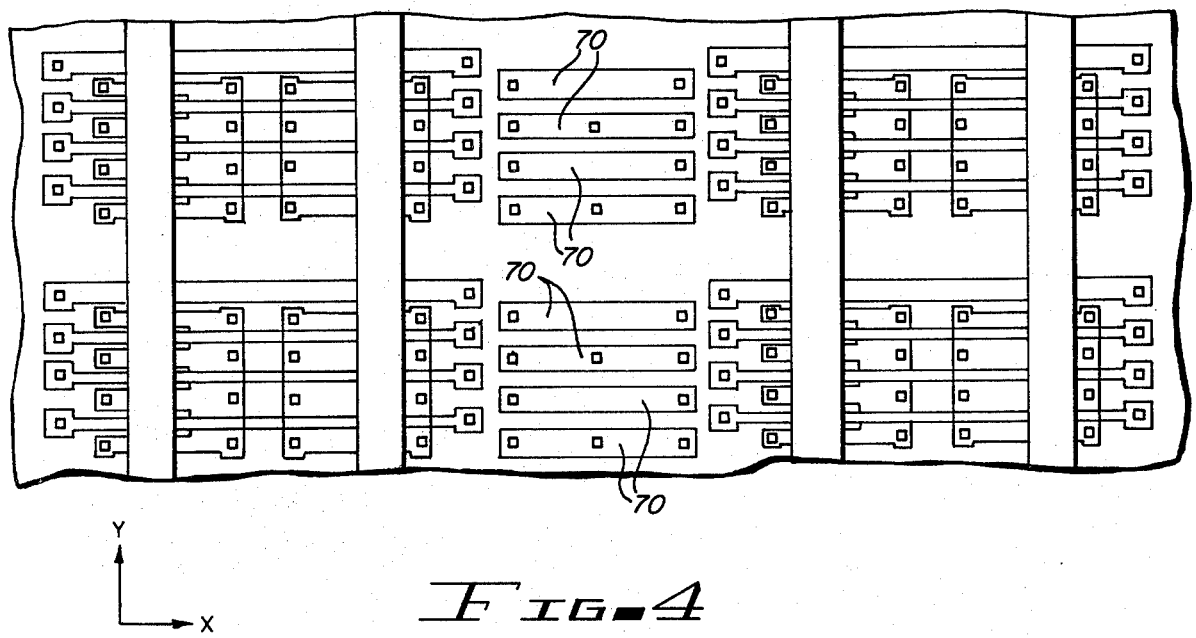
FIG. 4 illustrates the application of four unit cells of the type of FIG. 1 to a portion of a large scale integrated circuit layout.

The invention is further illustrated by FIG. 4 which shows four of the complementary device clusters of the type shown in FIG. 1 as being exemplary of their inclusion in a larger integrated circuit array. Regions 70 are for the purpose of additional interconnection underpasses and are formed from the gate layer 7 of conductive material shown in FIGS. 1 and 2. As may be seen, the power supply lines 9 and 10 run in a wide Y-direction and all of the interconnects are on an X-Y grid which provides for easy specification of the discretionary interconnection between the component parts shown. Additional metal layers may run transverse, i.e., in a Y-direction to the interconnection underpasses 70 shown in FIG. 4.

The features of this invention have been shown in terms of a particular CMOS integrated circuit embodiment and the application of discretionary wiring thereto. One skilled in the art will appreciate that the substructures described herein may be applicable to many kinds of MOS integrated circuits; for example, single channel integrated circuits may beneficially make use of the interconnection underpass features shown in connection with the source and drain regions of the devices of each conductivity type. Separate P conductivity-type wells may be provided and powered up individually where the subsidiary circuits or transistors are not required to operate on a continuous basis, e.g. input or output buffer devices or selected interal unit cells. These and other applications of the structures shown in the preferred embodiment of the invention may readily be adapted to other layouts employing, for example, different numbers of transistors in each unit cell.

What is claimed is:

1. At least two MOS transistors on a common substrate of a first conductivity type, each transistor comprising source and drain regions of a second conductivity type opposite said first conductivity type and a gate;
   at least one of said source and drain regions being common to each of said two transistors;
   means for contacting each of said source and drain regions at two locations so that said regions can act as both source or drain regions and as interconnection underpasses; and
   metallized connection means for supplying current to said MOS transistors, said connection means passing over each of said source and drain regions and over said gate, and said connection means lying between said contact means for each of said source and said drain regions.

2. A CMOS integrated circuit comprising pairs of complementary N-channel and P-channel devices, each transistor comprising source and drain regions and a gate; and
   contact means for contacting each of said source and drain regions at two locations so that said regions can act as both source or drain regions and as interconnection underpasses; and
   metallized connection means for supplying current to said MOS transistors, said connection means passing over each of said source and drain regions and over said gate, and said connection means lying between said contact means for each of said source and said drain regions.

3. The CMOS integrated circuit of claim 2, where said contact means are approximately equally spaced for each of said source and drain regions, the source and drain regions of the P-channel devices abutting their gates in an amount greater than the source and drain abutment to the gates of the N-channel devices.

4. An MOS integrated circuit comprising a substrate region of first conductivity type, a plurality of unit cells each comprising a cluster of MOS transistors at least two of which have common source and drain regions of opposite conductivity type to said substrate region, and each transistor having a gate and metallic connection means for supplying current to said MOS transistors, said connection means passing over each of said source and drain regions and over said gates, the improvement comprising alignment of the source gate and drain regions substantially parallel with a first direction in the plane of said circuit and alignment of said connection means substantially parallel with second direction perpendicular to said first direction in the plane of said circuit.

5. A CMOS integrated circuit comprising of unit cells each comprising a cluster of pairs of complementary transistors each of which has source and drain regions and a gate, and further including a pair of contact means for each of said source and drain regions so that said regions can act as both source or drain regions and as interconnection underpasses, said source and drain regions, said gates, and said pairs of contact means all laying substantially parallel with each other.

6. The CMOS integrated circuit of claim 5, further including a pair of metallic conduction means for supplying current to said complementary pairs in each cluster, said connection means passing over said source and drain regions between said pairs of contact regions and over said gates, and said connection means being perpendicular to said source and drain regions, said gates, and said pairs of contact means.

7. The CMOS circuit of claim 6, where each of said unit cells consists of a cluster of three pairs of complementary devices.

8. The CMOS circuit of claim 6, further including a pair of enhanced conductivity regions in each unit cell for making contact to said pair of metallic connection means.

9. The CMOS integrated circuit of claim 6, further including at least two unit cells having separate P conductivity-type wells for the location of the N-channel transistors in each cluster.

10. The CMOS integrated circuit of claim 7, where the source and drain regions of the P-channel transistors abut their respective gates along substantially all of their total peripheral widths and the source and drain regions of the N-channel transistors abut their respective gates along substantially less than their total peripheral widths in order to achieve an approximate match between the electrical characteristics of N- and P-channel transistors.

* * * * *